(12) United States Patent
Shor et al.

(10) Patent No.: US 6,906,966 B2
(45) Date of Patent: Jun. 14, 2005

(54) FAST DISCHARGE FOR PROGRAM AND VERIFICATION

(75) Inventors: Joseph S. Shor, Tel Mond (IL); Yan Polansky, Ramat Gan (IL)

(73) Assignee: Saifun Semiconductors Ltd., Netanya (IL)

( * ) Notice: Subject to any disclaimer, the term of this patent is extended or adjusted under 35 U.S.C. 154(b) by 42 days.

(21) Appl. No.: 10/461,437

(22) Filed: Jun. 16, 2003

(65) Prior Publication Data

US 2004/0252555 A1 Dec. 16, 2004

(51) Int. Cl.[7] .................................................. G11C 7/00
(52) U.S. Cl. .............. 365/189.09; 365/204; 365/185.23
(58) Field of Search ........................... 365/189.09, 204, 365/185.23, 185.25; 327/536, 563

(56) References Cited

U.S. PATENT DOCUMENTS

| | | |
|---|---|---|
| 4,961,010 A | 10/1990 | Davis |
| 5,029,063 A | 7/1991 | Lingstaedt et al. |
| 5,081,371 A | 1/1992 | Wong |
| 5,142,495 A | 8/1992 | Canepa |
| 5,142,496 A | 8/1992 | Van Buskirk |
| 5,276,646 A | 1/1994 | Kim et al. |
| 5,280,420 A | 1/1994 | Rapp |
| 5,381,374 A | 1/1995 | Shiraishi et al. |
| 5,534,804 A | 7/1996 | Woo |
| 5,553,030 A | 9/1996 | Tedrow et al. |
| 5,559,687 A | 9/1996 | Nicollini et al. |
| 5,581,252 A | 12/1996 | Thomas |
| 5,612,642 A | 3/1997 | McClintock |
| 5,636,288 A | 6/1997 | Bonneville et al. |
| 5,663,907 A | 9/1997 | Frayer et al. |
| 5,672,959 A | 9/1997 | Der |
| 5,675,280 A | 10/1997 | Nomura et al. |
| 5,708,608 A | 1/1998 | Park et al. |
| 5,717,581 A | 2/1998 | Canclini |
| 5,726,946 A | 3/1998 | Yamagata et al. |
| 5,760,634 A | 6/1998 | Fu |
| 5,808,506 A | 9/1998 | Tran |
| 5,815,435 A | 9/1998 | Van Tran |
| 5,847,441 A | 12/1998 | Cutter et al. |
| 5,880,620 A | 3/1999 | Gitlin et al. |
| 5,903,031 A | 5/1999 | Yamada et al. |
| 5,910,924 A | 6/1999 | Tanaka et al. |
| 5,946,258 A | 8/1999 | Evertt et al. |
| 5,963,412 A | 10/1999 | En |
| 6,005,423 A | 12/1999 | Schultz |

(Continued)

FOREIGN PATENT DOCUMENTS

| | | |
|---|---|---|
| EP | 0693781 | 1/1996 |
| EP | 0 843 398 | 5/1998 |
| JP | 02001118392 | 4/2001 |

OTHER PUBLICATIONS

Martin, "Improved Circuits for the Realization of Switched--Capacitor Filters", IEEE Transactions on Circuits and Systems, Apr., 1980, pp. 237–244, vol. CAS–27.

Klinke, et al., "A Very–High–Slew–Rate CMOS Operational Amplifier", IEEE Journal of Solid–State Circuits, 1989, pp. 744–746, vol. 24.

Shor, et al., "paper WA2.04.01—Self regulated Four–Phased Charged Pump with Boosted Wells", ISCAS 2002, 2002.

Fotouhl, "An Efficient CMOS Line Driver for 1.544–Mb/s T1 and 2.048–Mb/s E1 Applications", IEEE Journal of Solid–State Circuits, 2003, pp. 226–236, vol. 38.

Primary Examiner—Vu A. Le
(74) Attorney, Agent, or Firm—Eitan Law Group

(57) ABSTRACT

A discharge device comprising a transistor configured as a source follower, a capacitance load to be discharged connected via a switch to a source terminal of the source follower, a reference voltage connected to a gate terminal of the source follower, and a current load element connected to a drain terminal of the source follower.

29 Claims, 9 Drawing Sheets

U.S. PATENT DOCUMENTS

| | | | |
|---|---|---|---|
| 6,028,324 A | 2/2000 | Su et al. | |
| 6,040,610 A | 3/2000 | Noguchi et al. | |
| 6,064,251 A | 5/2000 | Park | |
| 6,075,402 A | 6/2000 | Ghilardelli et al. | |
| 6,081,456 A | 6/2000 | Dadashev | |
| 6,094,095 A | 7/2000 | Murray et al. | |
| 6,107,862 A | 8/2000 | Mukainakano et al. | |
| 6,118,207 A | 9/2000 | Ormerod et al. | |
| 6,130,572 A | 10/2000 | Ghilardelli et al. | |
| 6,130,574 A | 10/2000 | Bloch et al. | |
| 6,150,800 A * | 11/2000 | Kinoshita et al. | 323/280 |
| 6,154,081 A | 11/2000 | Pakkala et al. | |
| 6,157,242 A | 12/2000 | Fukui | |
| 6,188,211 B1 | 2/2001 | Rincon-Mora et al. | |
| 6,198,342 B1 | 3/2001 | Kawai | |
| 6,208,200 B1 | 3/2001 | Arakawa | |
| 6,246,555 B1 | 6/2001 | Tham | |
| 6,285,614 B1 * | 9/2001 | Mulatti et al. | 365/207 |
| 6,297,974 B1 | 10/2001 | Ganesan et al. | |
| 6,339,556 B1 | 1/2002 | Watanabe | |
| 6,353,356 B1 | 3/2002 | Liu | |
| 6,356,469 B1 | 3/2002 | Roohparvar et al. | |
| 6,359,501 B2 | 3/2002 | Lin et al. | |
| 6,400,209 B1 | 6/2002 | Matsuyama et al. | |
| 6,433,624 B1 | 8/2002 | Grossnickle et al. | |
| 6,452,438 B1 | 9/2002 | Li | |
| 6,577,514 B2 | 6/2003 | Shor et al. | |
| 6,608,526 B1 | 8/2003 | Sauer | |
| 6,614,295 B2 * | 9/2003 | Tsuchi | 327/563 |
| 6,627,555 B2 | 9/2003 | Eitan et al. | |
| 6,654,296 B2 | 11/2003 | Jang et al. | |
| 6,665,769 B2 | 12/2003 | Cohen et al. | |
| 6,677,805 B2 * | 1/2004 | Shor et al. | 327/536 |
| 2002/0145465 A1 | 10/2002 | Shor et al. | |
| 2003/0076159 A1 | 4/2003 | Shor et al. | |
| 2003/0202411 A1 | 10/2003 | Yamada | |
| 2004/0151034 A1 | 8/2004 | Shor et al. | |

* cited by examiner

FAST DISCHARGE FOR PROGRAM AND VERIFICATION

FIELD OF THE INVENTION

The present invention relates generally to discharge of high capacitances in memory cell arrays, and particularly to apparatus and methods for fast discharge of high capacitances suitable for regulation or switching of voltages in operation of memory cell arrays, such as regulation of voltages for programming such arrays.

BACKGROUND OF THE INVENTION

Non-volatile memory (NVM) arrays, such as erasable, programmable read only memory (EPROM) or flash memory arrays, or electrically erasable, programmable read only memory (EEPROM) arrays, require high positive or negative voltages to program and erase memory cells of the array.

NVM cells generally comprise transistors with programmable threshold voltages. For example, one type of non-volatile cell is a nitride, read only memory (NROM) cell, described in U.S. Pat. No. 6,011,725, the disclosure of which is incorporated herein by reference. Unlike a floating gate cell, the NROM cell may have two separated and separately chargeable areas. Each chargeable area defines one bit. The separately chargeable areas are found within a nitride layer formed in an oxide-nitride-oxide (ONO) stack underneath the gate. When programming a bit of an NROM cell, channel hot electrons are injected into the nitride layer. This is generally accomplished by the application of a positive gate voltage and positive drain voltage, the magnitude and duration of which are determined by different factors related to the amount of programming required. Programming and erasing of NROM cells are also described in U.S. Pat. No. 6,011,725.

One preferred procedure for programming bits, e.g., in NROM cells, is by the application of programming pulses to word lines and bit lines so as to increase the threshold voltage of the bits to be programmed. After application of one or more sets of programming pulses, the threshold voltages of the bits that are to be programmed may be verified to check if the threshold voltages have been increased to a target programmed state. Any bit that fails the program verify operation should preferably undergo one or more extra programming pulses. The sequence of application of programming pulses followed by verification may then continue until all the bits that should be programmed have reached the target programmed state.

The circuitry that supplies and controls the programming and verification voltages generally comprises a high voltage regulator or high voltage pump (the terms being used herein interchangeably). For example, in a typical EPROM system, it may be necessary to drive the word line (WL), to which the gate of the memory transistor (or cell) is connected, to different voltage levels in order to read, program or erase it. The load to be driven includes the word line, X-decoder (XDEC) and associated N-wells. This may be a very large capacitive load for a VLSI (very large scale integrated) circuit, ranging in value from 100 pF to several nF. During program (PGM) mode, the word line and associated voltages may be typically at a programming voltage (Vpgm) in the range of 8 to 11V, whereas in read (RD) or verify (VERF) modes, the word line may be typically at a read voltage (Vrd) in the range of 3 to 5V.

FIG. 1 illustrates prior art circuitry that employs a voltage regulator 100 to drive the WL loads at their DC levels. The circuitry of FIG. 1 is described hereinbelow, but first reference is made to FIG. 2, which illustrates a typical construction of voltage regulator 100. Voltage regulator 100 may be a Class A regulator, which means that it has strong drive in one direction only.

As seen in FIG. 2, a differential stage GM1 receives an input voltage IP at one of its inputs (the negative input in the illustration). The output of differential stage GM1 is connected via a node n1 to the input or gate (designated "g" in FIG. 2) of a PMOS (p-channel metal oxide semiconductor) transistor GM2. The supply terminal or source of transistor GM2 (designated "s" in FIG. 2) is connected to a positive voltage supply Vpp. Differential stage GM1 may also receive a voltage input from Vpp. The output or drain terminal of transistor GM2 (designated "d" in FIG. 2) is connected to a current load element 5 via a node n2. In FIG. 2, the current load element is a resistive voltage divider comprising a pair of resistors 7, but in the general case it may be any element that draws current, such as but not limited to, a transistor, current source, diode, etc. The output of transistor GM2 may be connected to a capacitive load CL. The output of the current load element 5 may be connected to the second input (the positive input in the illustration) of differential stage GM1 as its feedback FB. The feedback in voltage regulator 100 may equalize the two inputs to differential stage GM1, and accordingly, the output is at a voltage determined by the resistor ratio in the current load element 5. Voltage regulator 100 may comprise a Miller compensating capacitor Cm between the gate and drain of transistor GM2, between nodes n1 and n2.

In voltage regulator 100, the PMOS transistor GM2 is capable of pulling up the load strongly, while the resistors 7 discharge the load with a fixed current, which is usually small. In EPROM systems, the transitions are required to be fast. Accordingly, it is necessary to charge and discharge the WL load quickly, while consuming minimal quiescent current. However, the voltage regulator 100 of FIG. 2 is only capable of a quick charge, but not a quick discharge. Very often, the voltage regulators that are used are characterized by a weak drive in both directions (charge and discharge). In such a case both the charging and discharging processes are problematic.

The voltage regulator 100 may serve as the supply voltage to portions of the XDEC, and as such, may be connected to the source and bulk nodes of a PMOS transistor in the XDEC (not shown). Charging quickly presents no difficulty for such PMOS as the bulk voltage is always at an equal or higher potential than the drain and source, and the drain follows the source during charging. However, a fast discharge may be problematic, since there may be a delay between the discharge of the source to the drain. This means there may be a transient wherein the drain voltage is higher than the source and bulk. This may cause parasitic latch-up, which may result in catastrophic failure of the devices. This necessitates a controlled discharge over time, that is, with controlled dV/dt slopes. Unfortunately, this requirement contradicts the speed requirement between modes of operation.

Reference is now made again to FIG. 1, which illustrates a typical application of voltage regulator 100 to drive the WL loads at their DC levels. Although in many EPROM systems separate regulators drive the different voltages in program and read/verify, for simplicity FIG. 1 illustrates only one voltage regulator 100 that drives both voltage levels.

In the circuitry of FIG. 1, voltage regulator 100 may output to a switch S1. When switch S1 is conducting, it connects the output of voltage regulator 100 to a WL load, which may be at a voltage HV. A PMOS transistor P1 may have its source connected to a positive voltage supply Vdd. The gate of transistor P1 may be connected to a discharge voltage Disch_b. The drain of transistor P1 may be connected to a switch S2. When switch S2 is conducting, it connects the drain of transistor P1 to the WL load.

As mentioned hereinabove, it is necessary to make quick transitions between the various modes in order to enhance the speed of the operation. When the word line is in an active mode (PGM or RD), switch S1 is conducting and switch S2 is non-conducting. In this active mode, voltage regulator 100 is connected to the WL load and drives it to its appropriate DC level. In order to discharge the WL load, switch S1 becomes non-conducting and switch S2 becomes conducting and Disch_b="0". The PMOS transistor P1 discharges the load to Vdd. This discharge is highly non-linear because the strength of the PMOS transistor P1 is the square of its Vgs, which is equal to HV in this case. At the beginning of the discharge, the change in voltage over time is much more rapid than at the end, i.e., the slope (dV/dT) is much higher than at the end. After HV is discharged to Vdd, switch S1 is made conducting and switch S2 non-conducting. The voltage regulator 100 then re-charges the load to the appropriate level. In this manner the voltage regulator 100 only charges the load between modes, while the PMOS transistor P1 does all of the discharging.

For example, during the PGM to VERF transition, the WL must be discharged from Vpgm (e.g., 9–11V) to Vrd (e.g., 3–5V). The prior art circuit of FIG. 1 would require discharging first to VDD (e.g., 1.8–3.6V) and then recharging back to Vrd. For a fixed discharge time, this prior art method has much larger slopes (dV/dT) than a direct linear discharge from Vpgm to Vrd. In addition the prior art method requires a charge from VDD to Vrd in each PGM to VERF transition. However, this is wasteful in current compared to a direct discharge.

Thus, what is desired in the art and has been absent until now is a discharge method between PRM and VERF/RD states, which discharges directly and linearly from Vpgm to Vrd with a controlled slope.

SUMMARY OF THE INVENTION

The present invention seeks to provide a novel high-capacitance discharge device and method that may support fast program-to-read/verify (and vice versa) transitions. In accordance with an embodiment of the invention, a generally constant discharge current and discharge rate may be achieved, e.g., a direct and linear discharge from Vpgm to Vrd. The invention may be carried out, without limitation, with either a Class A regulator or a high impedance driver to speed up the program-to-verify transition, for example. The discharge circuit may be self-limiting, wherein the discharge ends when the desired voltage is achieved. A feedback signal may be provided to stop the discharge upon attaining a predetermined voltage level. The discharge device may use a regulated voltage supply generated on chip (e.g., from a high voltage regulator or pump) as a reference for the discharge operation.

There is thus provided in accordance with an embodiment of the present invention a discharge device comprising a transistor configured as a source follower, a capacitance load to be discharged connected via a switch to a source terminal of the source follower, a reference voltage connected to a gate terminal of the source follower, and a current load element connected to a drain terminal of the source follower.

In accordance with an embodiment of the present invention the source follower comprises a PMOS (p-channel metal oxide semiconductor) transistor, and the discharge device discharges voltage from an initial voltage to a final voltage, wherein the final voltage is less than the initial voltage.

Further in accordance with an embodiment of the present invention the current load element comprises at least one of a current source, a transistor, a resistive voltage divider, and a diode.

Still further in accordance with an embodiment of the present invention a drain terminal of the source follower is also connected to a voltage level sensing circuit.

In accordance with an embodiment of the present invention the reference voltage is set approximately at a final voltage level minus the threshold voltage Vt of the source follower.

Further in accordance with an embodiment of the present invention the final voltage level is equal to the sum of the reference voltage and the threshold voltage Vt of the source follower.

Still further in accordance with an embodiment of the present invention the initial voltage comprises a program voltage sufficient for programming a bit in a non-volatile memory (NVM) array, and the final voltage comprises at least one of a program verify and a read verify voltage level.

In accordance with an embodiment of the present invention when the capacitance load to be discharged is at a first voltage level, an output of the voltage level sensing circuit is at a first state, and when the capacitance load to be discharged is at a second voltage level, the output of the voltage level sensing circuit changes to a second state.

Further in accordance with an embodiment of the present invention the voltage level sensing circuit comprises an inverter.

Still further in accordance with an embodiment of the present invention the voltage level sensing circuit comprises an inverter and the first state comprises a first logical state, wherein the current load element is initially turned off, the switch is non-conducting and the capacitance load is at a program voltage level, and wherein during discharge, the current load element is turned on, the switch becomes conducting, and current from the current load element flows through the source follower and discharges the capacitance load at a constant rate, such that when the voltage difference between the capacitance load and the reference voltage approaches the threshold voltage Vt of the source follower, the source follower becomes significantly less conducting and the second state comprises a second logical state indicating that the discharge is complete.

In accordance with an embodiment of the present invention after discharge, the voltage level sensing circuit returns to an initial state. In the initial state the current load element and/or the switch may be non-conducting.

Further in accordance with an embodiment of the present invention the discharge is initiated by a control signal and completed when the voltage level sensing circuit reaches the second logical state.

There is also provided in accordance with an embodiment of the present invention a discharge device comprising a sensing circuit comprising a transistor configured as a source follower, wherein a gate terminal of the source follower is connected to a reference voltage, a drain terminal of the source follower is connected to a current load element, and a source terminal of the source follower is connected to a port of a first switch, another port of the first switch being connected to a capacitance load, the sensing circuit being operative to detect termination of discharging the capacitance load, and a discharge circuit connected to the sensing circuit, operative to discharge the capacitance load, the discharge circuit comprising a second switch and a third switch with opposite polarity control such that when one of the second and third switches is conducting the other of the second and third switches is non-conducting, wherein ports of the second and third switches are connected to a common node, another port of the second switch being connected to the capacitance load and another port of the third switch being connected to another current load element, wherein the common node is connected to a second node, the second node being connected to ground via a capacitor, the second node being further connected to a gate terminal of a PMOS transistor, wherein a source terminal of the PMOS transistor is connected to the capacitance load and a drain terminal of the PMOS transistor is connected to a predefined voltage.

In accordance with an embodiment of the present invention the sensing circuit is operative to output a signal that causes the second and third switches of the discharge circuit to change polarity.

Further in accordance with an embodiment of the present invention the drain terminal of the source follower of the sensing circuit is connected to an inverter. The predefined voltage may comprise Vdd or ground, for example.

Still further in accordance with an embodiment of the present invention during a program mode, the second switch is conducting and the third switch is non-conducting, the second node charges to the voltage of the capacitance load, and the PMOS transistor of the discharge circuit is non-conducting.

In accordance with an embodiment of the present invention during discharge, the second switch is non-conducting and the third switch is conducting, and the second node discharges at a fixed discharge rate.

Further in accordance with an embodiment of the present invention the PMOS transistor of the discharge circuit is configured as a source follower.

Still further in accordance with an embodiment of the present invention the voltage of the capacitance load equals the sum of the voltage at the second node and the threshold voltage Vt of the source follower of the discharge circuit.

There is also provided in accordance with an embodiment of the present invention a discharge device comprising a constant current supply having a reference voltage input (Vref), and outputting a constant discharge current to a discharge path, and a voltage multiplexer operative to supply a discharge reference voltage (Vdref) from a voltage input Vdsch to the discharge path, the voltage multiplexer being connected to a NAND gate and a capacitance load, wherein the discharge path is connected to a current-to-voltage transformer, which in turn is connected to a voltage level sensor.

In accordance with an embodiment of the present invention an initialization circuit inputs to the current-to-voltage transformer and the voltage level sensor.

Further in accordance with an embodiment of the present invention the voltage level sensor is operative to send a feedback signal to the NAND gate.

Still further in accordance with an embodiment of the present invention the voltage multiplexer is also connected to the initialization circuit.

In accordance with an embodiment of the present invention the voltage multiplexer comprises an inverter connected to the NAND gate.

Further in accordance with an embodiment of the present invention the inverter outputs a signal to a gate terminal of a PMOS transistor, wherein the drain terminal and bulk of the PMOS transistor are connected to the capacitance load, and the source of the PMOS transistor is connected to the discharge path.

BRIEF DESCRIPTION OF THE DRAWINGS

The present invention will be understood and appreciated more fully from the following detailed description taken in conjunction with the drawings in which.

DETAILED DESCRIPTION OF A PREFERRED EMBODIMENT

Figure 1:
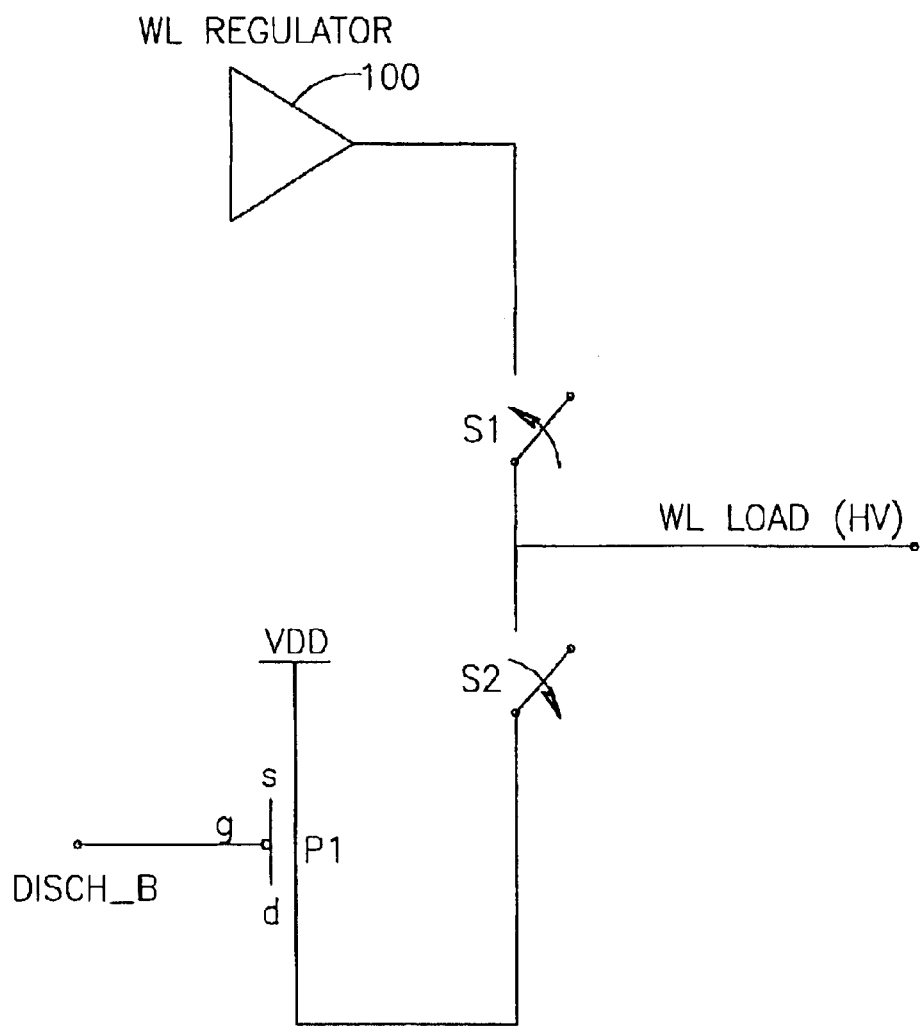
FIG. 1 is a simplified block diagram of a prior art circuit that incorporates a voltage regulator to drive word line loads at DC levels, and to discharge the word lines between modes of programming and read/verify.
Figure 2:
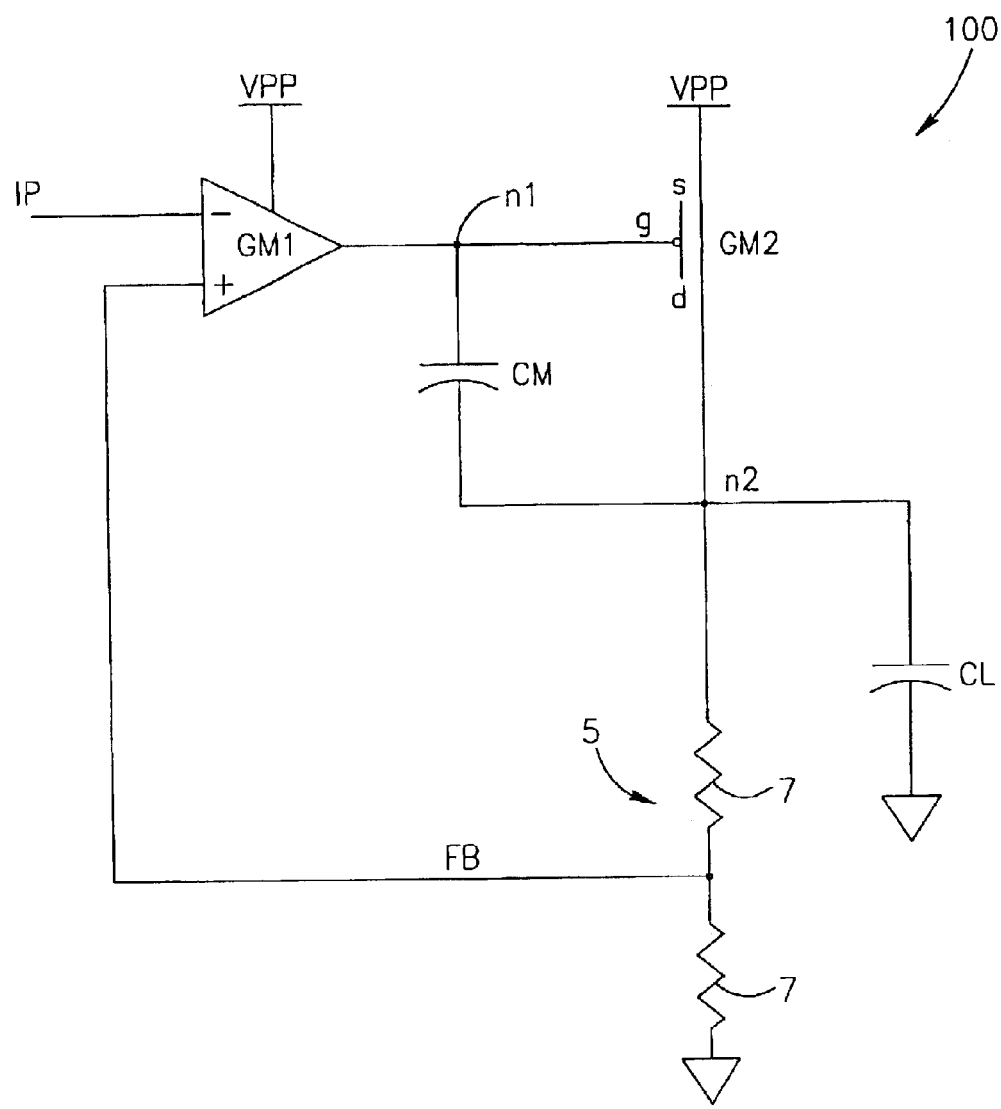
FIG. 2 is a simplified block diagram of a voltage regulator typically used in the prior art to drive the voltages required for program and read/verify.
Figure 3:
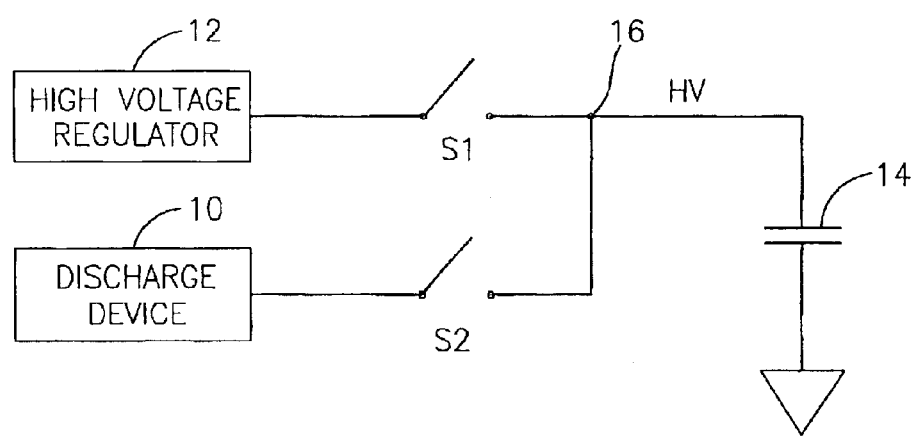
FIG. 3 is a simplified block diagram of a circuit using a discharge device, in accordance with an embodiment of the present invention.

Reference is now made to FIG. 3, which illustrates a simplified block diagram of a circuit using a discharge device 10, in accordance with an embodiment of the present invention.

The circuit may comprise a pair of switches S1 and S2, which switch between a high voltage regulator 12 and discharge device 10. The switches S1 and S2 preferably switch with opposite polarity control such that when one switch is conducting the other switch is non-conducting. Each switch is preferably conducting during a different mode of operation, as is now explained.

High voltage regulator 12 may supply voltage levels to a high capacitance load 14, which may be bits of a non-volatile memory (NVM) array, such as but not limited to, an NROM cell array. During program mode, high voltage regulator 12 may supply voltages for the application of programming pulses, e.g., in the range of 8–10 V, and verification, e.g., in the range of 5–7 V. It is emphasized that the invention is not limited to these voltage levels.

High voltage regulator 12 may supply the load during the active states, namely program (PGM), read (RD) and verify (VERF). In these states, switch S1 may be conducting and switch S2 may be non-conducting. During the transition between PGM and VERF, S1 becomes non-conducting and switch S2 becomes conducting, thus enabling the discharge circuit to discharge the load.

For example, during the application of programming pulses, switch S1 may be conducting and switch S2 may be non-conducting. High voltage regulator 12 may then supply programming voltage levels to high capacitance load 14 via a high voltage (HV) node 16. After application of the programming pulses, verification of the threshold voltages of the bits may be carried out. In order to pass from the program mode to the verification mode, switch S1 may be non-conducting and switch S2 may be conducting, thereby connecting high voltage node 16 to discharge device 10. As is described in detail further hereinbelow, discharge device 10 rapidly discharges to a target voltage level (in this case, the level used for verification). When the HV node 16 reaches the desired final voltage, the circuit of discharge device 10 may indicate that the discharge is completed, whereupon switch S2 becomes non-conducting and switch S1 becomes conducting. High voltage regulator 12 may then supply the verification voltage levels to the array to verify the threshold voltages of the bits to which the programming pulses have been applied.

Figure 4:
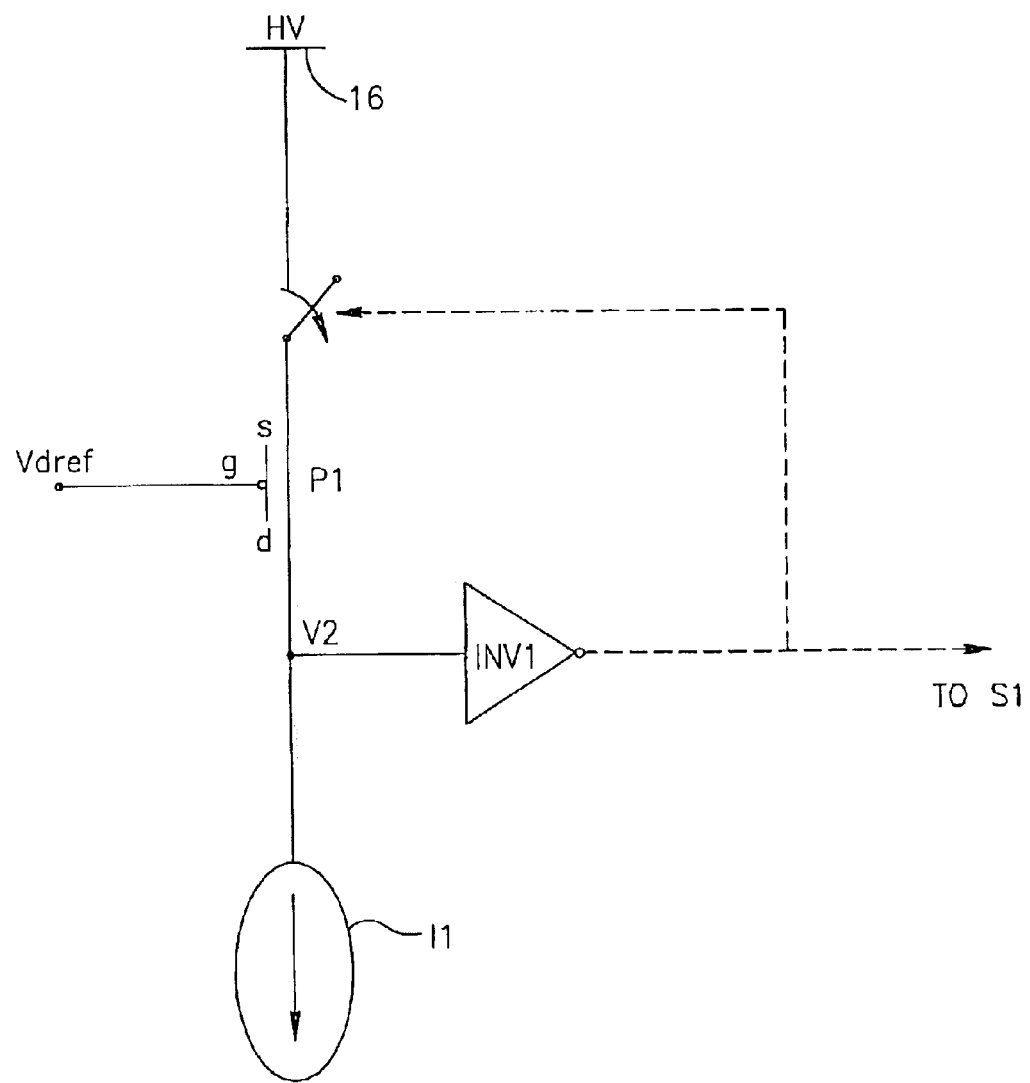
FIG. 4 is a simplified block diagram of circuitry for the discharge device of FIG. 3, in accordance with an embodiment of the invention, wherein the circuitry of FIG. 4 may be used to discharge the load linearly dependent on the load capacitance, or alternatively may be used as a sensing circuit to detect the end of the discharge but not to perform the discharge itself.

Reference is now made to FIG. 4, which illustrates a simplified block diagram of circuitry for the discharge device 10, in accordance with an embodiment of the invention. The circuitry may comprise a PMOS (p-channel metal oxide semiconductor) transistor P1, which may have a bias voltage, such as a reference voltage Vdref, at its gate. The source of transistor P1 may be connected to one of the ports of switch S2, which may connect the source to high capacitance load 14 (FIG. 3) via HV node 16. The drain of transistor P2 may be connected to a node V2. A current load element I1 may be connected to node V2. The current load element I1 is illustrated as a current source, but is not limited to this example, and may alternatively comprise any element that draws current, such as but not limited to, a transistor, a resistive voltage divider, a diode, and others. Node V2 may also be connected to a voltage level sensing circuit, such as but not limited to, an inverter INV1.

PMOS transistor P1 is preferably configured as a source follower. A source follower is a method of configuring a transistor, wherein the output voltage is at the source of the transistor, and the output "follows" the input voltage, which is connected to the gate of the transistor. By "following" it is meant that the output voltage equals the input voltage minus the threshold voltage.

In accordance with one embodiment of the invention, the reference voltage Vdref may be set at approximately the final verify voltage diminished by the threshold voltage (Vt). Before the discharge cycle, node V2 may be charged to a logical "1" state, the current load element I1 may be turned off, switch S2 may be non-conducting (S1, not shown, may be conducting) and the HV node 16 may be at Vpgm. When the discharge turns on, current load element I1 may be turned on, switch S2 may become conducting, and switch S1 may become non-conducting. Since transistor P1 has a very large Vgs, node V2 may be driven to high voltage, initially maintaining a logical "1" state. The current from current load element I1 may flow through transistor P1 and discharge HV node 16 at a constant rate.

As the high voltage of HV node 16 falls, the Vgs of transistor P1 decreases, as does its drive strength. When the voltage difference between the HV node 16 and reference voltage Vdref (HV−Vdref) approaches the level of the threshold-voltage Vt, transistor P1 becomes significantly less conducting or non-conducting. Current load element I1 may now have more drive strength than transistor P1, and node V2 may be pulled down to a logical "0" state. Inverter INV1 may sense the change in logical state of node V2, and output a signal indicating that the discharge cycle is complete. This signal may cause the system to transfer from the discharge state to the read or verify state. This may cause switch S2 to become non-conducting and switch S1 to become conducting. The load may now be driven by the high voltage regulator 12 (FIG. 3). Although high voltage regulator 12 may not necessarily have the strength to discharge the large load capacitance, nevertheless, it may easily discharge its own self-capacitance before the discharge cycle is complete.

The discharge time may be described by the following equation:

$$dT = \frac{C \cdot dV}{I} \quad (1)$$

where dT=Discharge time
C=capacitance
dV=Vpgm−Vrd
I=Discharge current

In the embodiment of FIG. 4, C is the load capacitance and I is the current provided by current load element I1. Accordingly, the discharge time and slope (dV/dT) may be linearly dependent on the load.

As mentioned above, it may be convenient to set the reference voltage at the difference between the read voltage (which may be equal to the verify voltage) and the threshold voltage (Vrd−Vt). A circuit which may be used to accomplish this is now described with reference to FIG. 5. The regulator output Vrd may be input to the source terminal of a PMOS transistor P2. The gate and drain terminals of transistor P2 may be connected to a current source I5. The output Vdref of this circuit may be approximately the difference between the read voltage and the threshold voltage (Vrd−Vt), assuming that transistor P2 is a large transistor compared to the current it draws.

In the previous embodiment, the discharge time is dependent on the load capacitance. In accordance with another embodiment of the present invention, the same circuitry of FIG. 4 is used only to detect the end of the discharge, but not to perform the discharge itself. Instead, the discharge may be carried out by another circuit illustrated and described hereinbelow with reference to FIG. 6. In such an embodiment, wherein the circuit of FIG. 4 is used as a sensing circuit, when HV node 16 reaches the sum of the reference voltage Vdref and the threshold voltage Vt, the inverter INV1 may trip and latch the system into a read state. The current passed by current load element I1 may be small.

Figure 6:
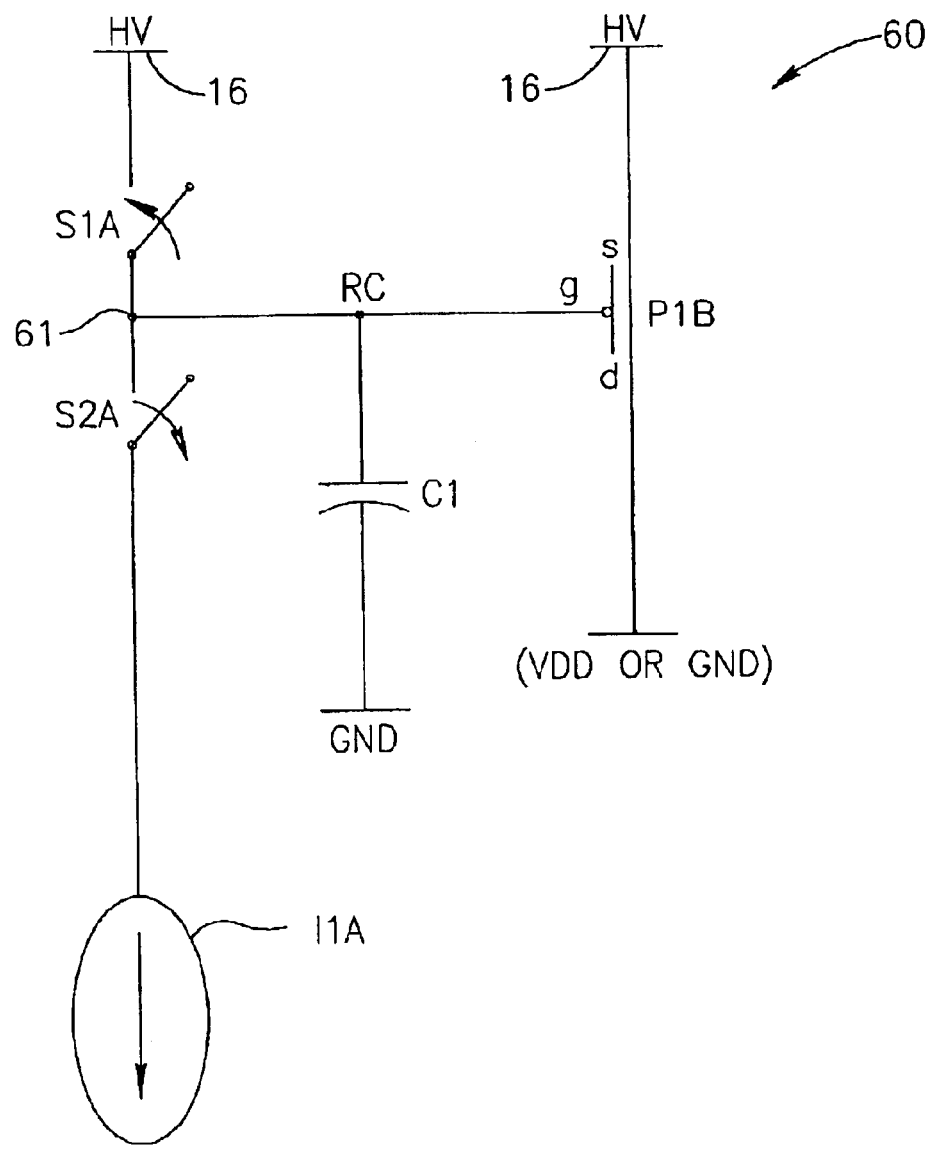
FIG. 6 is a simplified block diagram of a circuit that may be used to discharge the load with a fixed discharge time, in accordance with an embodiment of the invention.

Reference is now made to FIG. 6, which illustrates a circuit 60 that may be used to discharge the load with a fixed discharge rate, in accordance with an embodiment of the invention. The circuit for discharge device 60 may comprise switches S1A and S2A, which may have the same phases respectively as switches S1 and S2 of discharge device 10 of FIG. 3. The HV node 16 may be connected to one port of switch S1A. One of the ports of switch S2A may be connected to a current source I1A. The other ports of switches S1A and S2A may be mutually connected to a node 61. Node 61 may be connected to a node RC, which may be connected to ground (GND) via a capacitor C1. Node RC may be further connected to the gate of a PMOS transistor P1B. The source of PMOS transistor P1B may be connected to HV node 16. The drain of PMOS transistor P1B may be connected to some voltage, such as Vdd or GND.

The PMOS transistor P1 of FIG. 4 may be incorporated into the circuitry of FIG. 6, wherein the arrow "to S1" in FIG. 4 may be connected to either one of switches S1A and S2A of FIG. 6.

During program mode, switch S1A is conducting and switch S2A is non-conducting, which may charge node RC to the voltage of HV node 16. The PMOS transistor P1B is non-conducting since its Vgs is zero. During the discharge cycle, switch S1A is made non-conducting and switch S2A is conducting. Node RC is discharged according to equation (1), where C=C1 and I=I1A.

PMOS transistor P1B is preferably configured as a source follower. Since PMOS transistor P1B is connected as a source follower, the voltage at HV node 16 equals the sum of the voltage at node RC and the threshold voltage Vt. P1B is preferably a large transistor, and it may drive the output load easily. HV node 16 follows node RC until the discharge is complete and the circuit is latched into read mode by the circuit of FIG. 4 used as a sensing circuit. It is noted that the discharge may be independent of the load capacitance at HV node 16, and may be determined by the capacitance C1 and the discharge current I1A.

Further embodiments of the invention, wherein the discharge time is dependent on the load capacitance (as described above with reference to FIG. 4), are now described in greater detail, including initial conditions and logical operation of the discharge.

Figure 7:
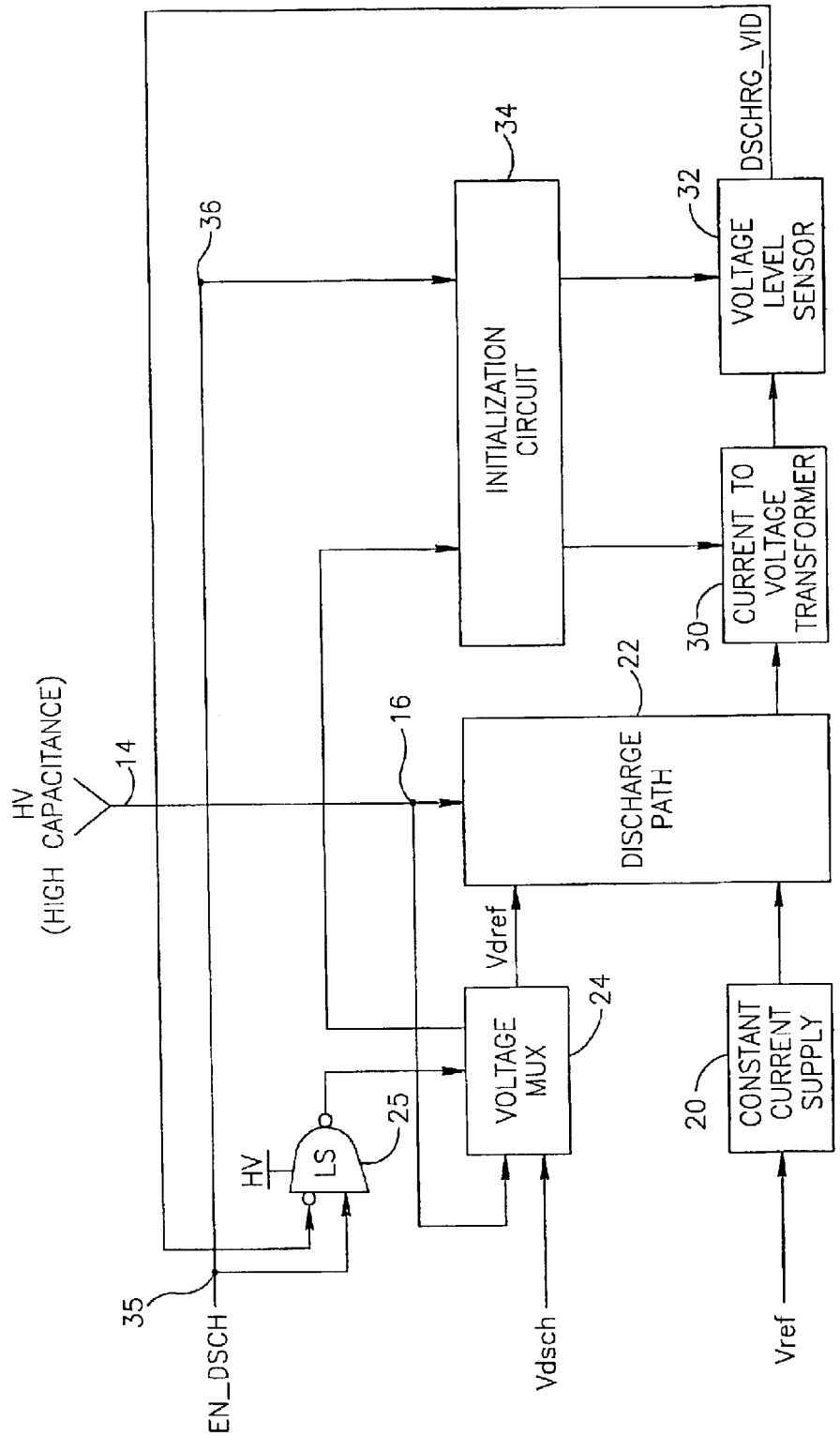
FIG. 7 is a simplified block diagram of a discharge device, in accordance with another embodiment of the invention.

Reference is now made to FIG. 7, which illustrates a simplified block diagram of a discharge device 70, in accordance with one embodiment of the invention. It is emphasized that the invention is not limited to the block diagram shown in FIG. 7. The description that follows is a general description of the block diagram of FIG. 7. Afterwards, a more detailed description will follow with reference to FIGS. 8A–8B.

As seen in FIG. 7, discharge device 10 may comprise a constant current supply 20 which may receive a reference voltage input (Vref), and which may output a constant discharge current to a discharge path 22. A voltage multiplexer (voltage mux) 24 may supply a discharge reference voltage (Vdref) to discharge path 22. Voltage multiplexer 24 may receive an output from a NAND gate 25 and the high capacitance load 14 via high voltage node 16. Voltage multiplexer 24 may generate Vdref from a voltage input Vdsch. Discharge path 22 may output to a current-to-voltage transformer 30, which in turn outputs to a voltage level sensor 32. An initialization circuit 34 may input to current-to-voltage transformer 30 and voltage level sensor 32. Voltage level sensor 32 may send a feedback signal dschrg_vid to an invert-input of NAND gate 25. Voltage multiplexer 24 may also be connected to initialization circuit 34. A signal to start the discharge process, referred to as the en_dsch signal, may be input to NAND gate 25 and initialization circuit 34 via nodes 35 and 36 respectively.

Discharge of the voltage from high voltage regulator 12 may be initiated by the en_dsch signal generated on a chip, and may be terminated by the dschrg_vid feedback signal, output from voltage level sensor 32.

Figure 8A:
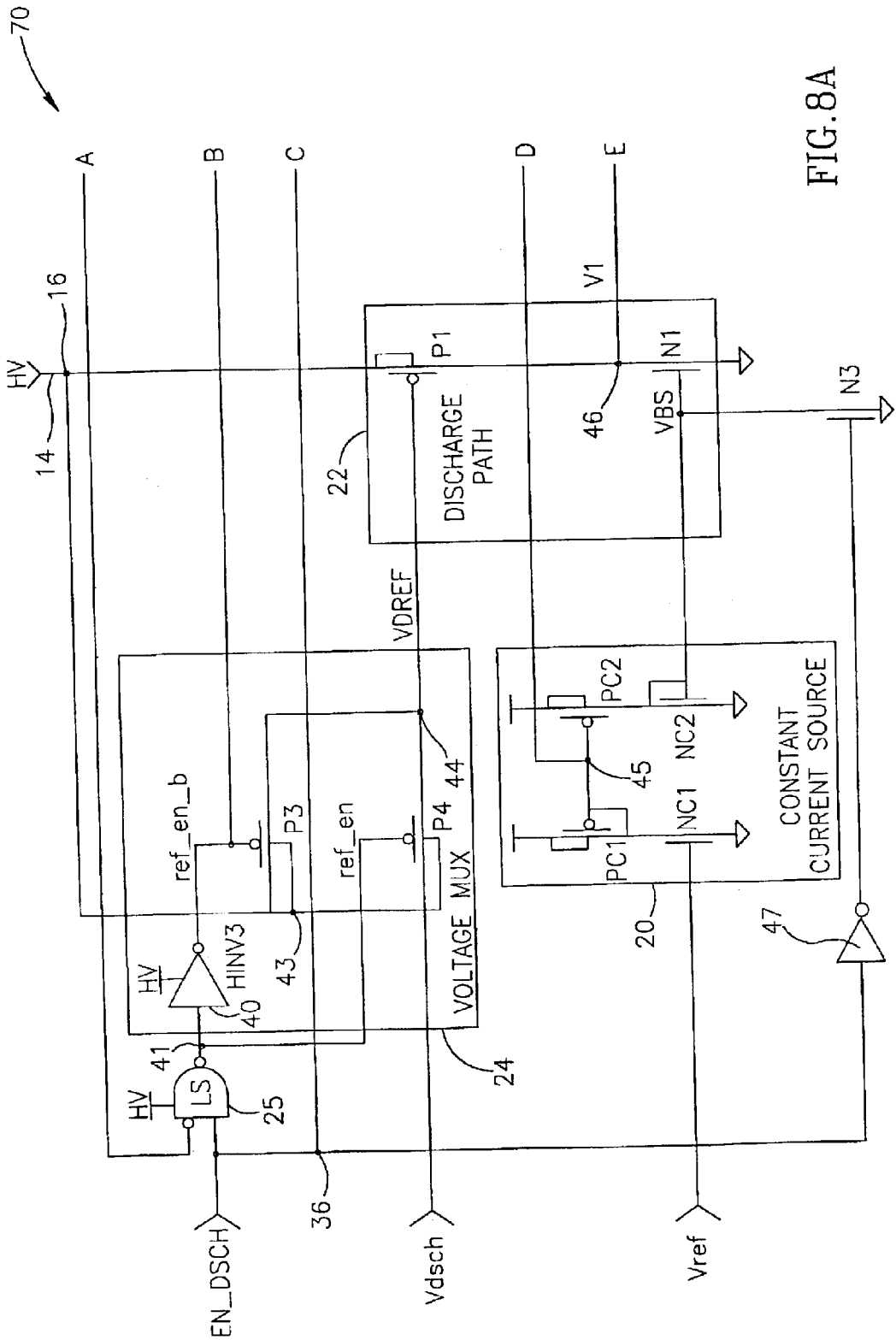
FIGS. 8A–8B form a simplified circuit schematic of the discharge device of FIGS. 3 and 4, in accordance with an embodiment of the invention.
Figure 8B:
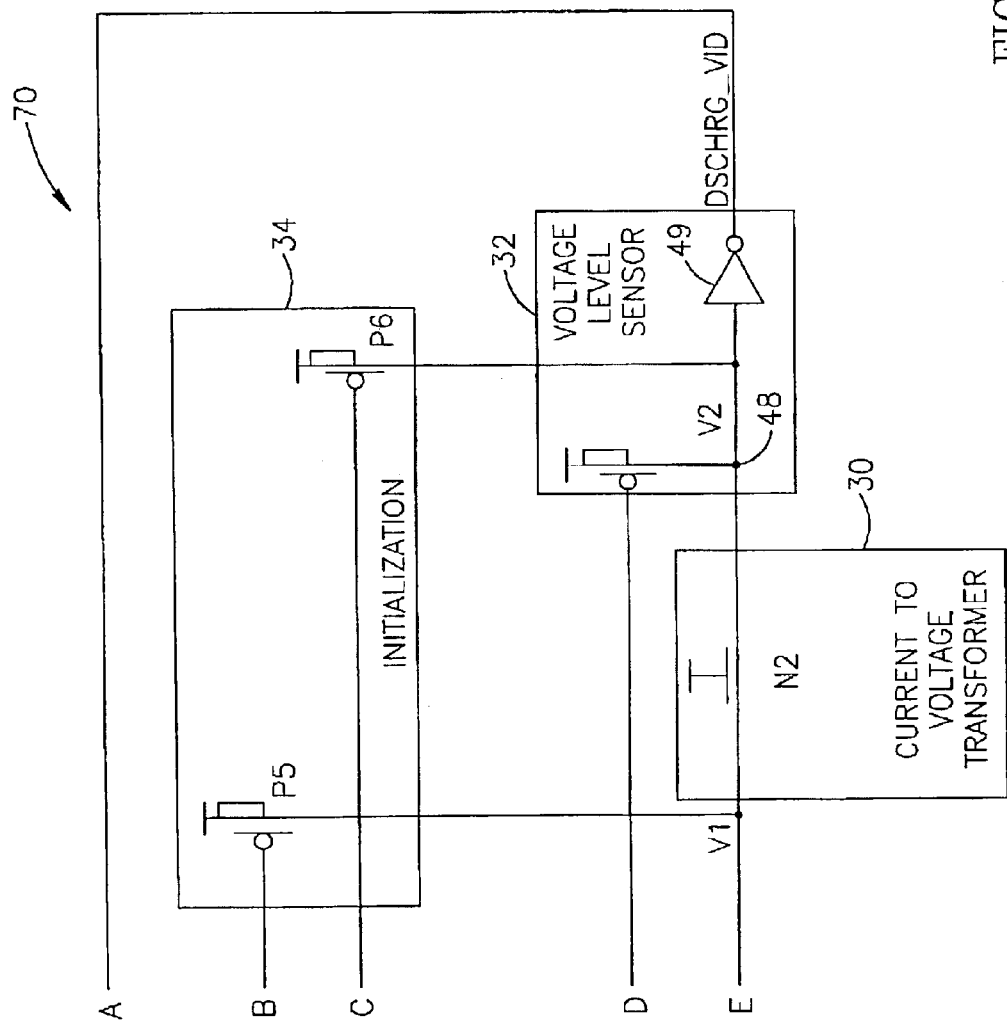

Reference is now made to FIGS. 8A–8B, which illustrate a simplified circuit schematic of the discharge device 10, in accordance with one embodiment of the invention. It is emphasized that the invention is not limited to the schematic shown in FIGS. 8A–8B.

Voltage multiplexer 24 may comprise an inverter 40, which is connected to the output of NAND gate 25 via a node 41. Inverter 40 outputs a signal ref_en_b to a node 42, which may be connected to the gate of a PMOS transistor P3. The drain and bulk of PMOS transistor P3 may be connected to the high capacitance load 14 via nodes 16 and 43. The source of PMOS transistor P3 may be connected to a node 44. Another PMOS transistor P4 may be connected at its gate to a ref_en signal coming from node 41. The drain and bulk of PMOS transistor P4 may be connected to node 43, and its source may be connected to node 44, outputting Vdref to discharge path 22.

Constant source supply 20 may comprise an NMOS (n-channel metal oxide semiconductor) transistor NC1, whose gate is connected to Vref, the drain being connected to the drain of a PMOS transistor PC1, and whose source is grounded. The source and bulk of PMOS transistor PC1 may be connected to Vdd. The gate of PMOS transistor PC1 may be connected to the gate of another PMOS transistor PC2 via a node 45. The source and bulk of PMOS transistor PC2 may be connected to Vdd. The drain of PMOS transistor PC2 may be connected to the drain of an NMOS transistor NC2. The gate of NMOS transistor NC2 may be connected to the gate of an NMOS transistor N1 of discharge path 22 via node Vbs, and the source of NMOS transistor NC2 may be grounded. PMOS transistors PC1 and PC2 and NMOS transistors NC1 and NC2 form a current mirror and amplifying circuit.

The Vdref output may be connected to a gate of a PMOS transistor P1 in discharge path 22. The source and bulk of PMOS transistor P1 may be connected to high voltage node 16. The drain of PMOS transistor P1 may be connected to the drain of NMOS transistor N1 via node 46. The source of NMOS transistor N1 may be grounded.

Node Vbs may be connected to the drain of an NMOS transistor N3, which may be external to discharge path 22. The en_dsch signal may be input to an inverter 47 via nodes 35 and 36. Inverter 47 outputs to the gate of NMOS transistor N3. The source and bulk of NMOS transistor N3 may be grounded.

The gate of a PMOS transistor P5 of initialization circuit 34 may be connected to node 42 of voltage multiplexer 24. The bulk and drain of PMOS transistor P5 may be connected to Vdd. The source of PMOS transistor P5 may be connected to a node V1 external to initialization circuit 34. The gate of a PMOS transistor P6 of initialization circuit 34 may be connected via node 36 to the en_dsch signal. The bulk and drain of PMOS transistor P6 may be connected to Vdd. The source of PMOS transistor P6 may be connected to a node V2 in voltage level sensor 32.

Current-to-voltage transformer 30 may comprise an NMOS transistor N2, whose gate is connected to Vdd, its drain to node V1 and its source to a node 48 in voltage level sensor 32.

Voltage level sensor 32 may comprise a PMOS transistor P2 whose gate is connected to node 45 in constant current source 20. The bulk and drain of PMOS transistor P2 may be connected to Vdd. The source of PMOS transistor P2 may be connected to node 48. Node V2 may be connected to an inverter 49, which outputs the signal dschrg_vid to NAND gate 25.

Figure 5:
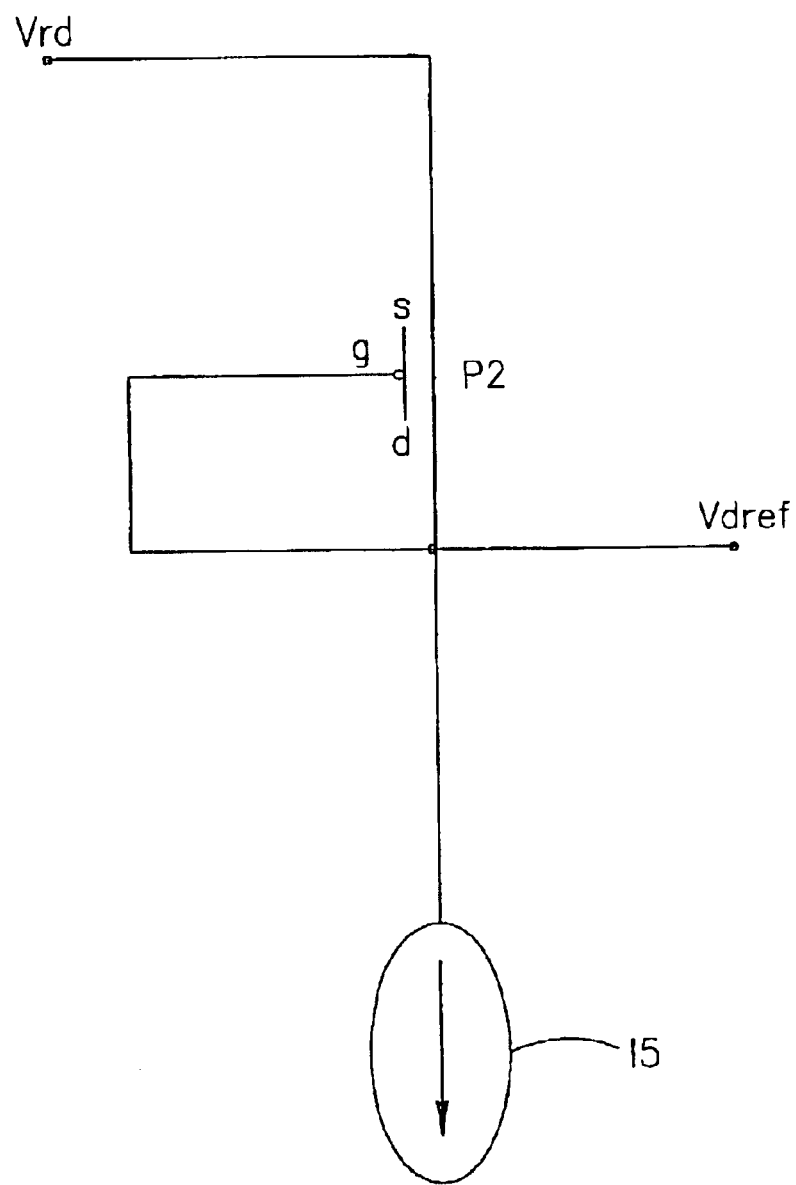
FIG. 5 is a simplified block diagram of circuitry that may be used to set a reference voltage Vdref at the difference between the read voltage and the threshold voltage (Vrd–Vt), in accordance with another embodiment of the invention.

Operation of the discharge device 10, in accordance with one embodiment of the invention, is now described with reference to FIGS. 5 and 7. It is emphasized that the invention is not limited to this exemplary embodiment.

Before discharging, discharge device 10 may be initialized. One way of initializing discharge device 10 may comprise setting en_dsch to GND, ref_en to a high voltage level and ref_en_b to GND. These settings force PMOS transistors P5 and P6 of initialization circuit 34 and NMOS transistor N3 to conduct, applying a ground potential to node Vbs and applying Vdd to nodes V1 and V2 (V2 in voltage level sensor 32). T-his may ensure that dschrg_vid is grounded at the start of each discharge operation.

As mentioned hereinabove with reference to FIG. 3, during the application of programming pulses, switch S1 may be conducting and switch S2 may be non-conducting. High voltage regulator 12 may then supply programming voltage levels to the high capacitance load 14, while discharge device 10 is disabled. When discharge device 10 is disabled, PMOS transistor P6 of initialization circuit 34 is conducting, connecting node V2 to Vdd and setting voltage level sensor 32 to GND via inverter 49. As mentioned hereinabove with reference to FIG. 3, during the application of programming pulses, high voltage node 16 is isolated from the discharge device 10 by switch S2, which is non-conducting. Constant current source 20 is disabled. Discharge path 22 may be disabled by applying a high voltage to node Vdref. Since node Vdref is connected to the gate of PMOS transistor P1, this means that Vgs (gate-source voltage) of PMOS transistor P1 equals 0V. PMOS transistor P3 of voltage multiplexer 24 may be forced to a conducting state by ref_en_b signal which is at GND in idle. PMOS transistor P4 of voltage multiplexer 24 may be forced to a non-conducting state by ref_en signal being at a high voltage level.

When the program-to-verify transition is enabled, switch S2 connects the high voltage node 16 to the discharge device 10 (as described above with reference to FIG. 3). As soon as discharge device 10 is enabled, the en_dsch signal goes to Vdd, the ref_en signal goes to GND and the ref_en_b signal goes to high voltage. The PMOS transistor P1 of discharge path 22 charges node V1 (via node 46) to the voltage level HV, and constant current source 20 starts to generate a constant discharge current. The NMOS transistor N2 of current-to-voltage transformer 30 is non-conducting, thereby isolating nodes V1 and V2 from one another. Nodes V1 and V2 may be disconnected from Vdd by forcing PMOS transistors P5 and P6 of initialization circuit 34 to a non-conducting state. Node Vbs may be disconnected from ground by forcing NMOS transistor N3 to a non-conducting state.

PMOS transistor P3 of voltage multiplexer 24 may be non-conducting by applying high voltage to its gate. PMOS transistor P4 of voltage multiplexer 24 may be conducting by applying GND to its gate and discharging Vdref to the Vdsch voltage level. This forces PMOS transistor P1 of discharge path 22 to a conducting state and pulls node V1 to the high voltage Vdsch voltage level.

In voltage level sensor 32, node V2 is charged to Vdd by PMOS transistor P2. PMOS transistor P2 is preferably very "weak" in terms of current supply ability, applying a very low amount of current to node V2, keeping it just slightly connected to Vdd.

The constant discharge current may be generated by constant current source 20 as follows. NMOS transistor NC1 may be driven by reference voltage Vref, and the current mirror and amplifying circuit consisting of transistors PC1, PC2 and NC2 reflect and amplify the current from transistor NC1. The amplification level of the current may be tunable in accordance with the discharge rate required. For a faster discharge, the amplification may be increased and vice versa.

The Vgs of PMOS transistor P1 of discharge path 22 is preferably much higher than its threshold voltage Vt. Accordingly, PMOS transistor P1 starts to lead the current, that is set by NMOS transistor N1, until high voltage node 16 (via node 46) and node V1 discharge to the Vdref+Vt(P1) voltage level. The Vgs of PMOS transistor P1 then drops below Vt and forces PMOS transistor P1 to a non-conducting state, thereby disconnecting node V1 from high voltage node 16 (via-node 46). The capacitance of node V1 is preferably very low compared to the high voltage node 16 (via node 46). NMOS transistor N1 preferably continues to conduct the same amount of current, rapidly discharging node V1 to GND. NMOS transistor N2 goes to a conducting state, thereby connecting nodes V1 and V2 to each other.

The discharge current supplied by NMOS transistor N1 to node V2 is much higher than the charging current that is sourced to node V2 by PMOS transistor P2. Node V2 is accordingly discharged to GND via NMOS transistors N1 and N2, whereupon inverter 49 changes the logic state and sets the dschrg_vid signal to Vdd.

The dschrg_vid signal, now set to Vdd, is input to NAND gate 25. The logic circuitry of NAND gate 25 and inverter 40 sets the ref_en signal to Vdsch+Vt (high voltage) level and the ref_en_b to GND, This forces PMOS transistor P3 to a conducting state and PMOS transistor P4 to a non-conducting state. Node 44 is thereby charged to a high voltage level (Vdsch+Vt), This may ensure that PMOS transistor P1 is in a non-conducting state, thus eliminating a possible stability problem of the circuit if the high voltage node 16 is coupled to some high voltage. Usually the en_dsch generator gets the dschrg_en signal generated on chip as a feedback for closing the discharge device 10.

It will be appreciated by person skilled in the art, that the present invention is not limited by what has been particularly shown and described herein above. Rather the scope of the present invention is defined only by the claims that follow:

What is claimed is:

1. A discharge device comprising:
   a transistor configured as a source follower;
   a capacitance load to be discharged connected via a switch to a source terminal of said source follower;
   a reference voltage connected to a gate terminal of said source follower; and
   a current load element connected to a drain terminal of said source follower.

2. The discharge device according to claim 1, wherein said source follower comprises a PMOS) p-channel metal oxide semiconductor) transistor, and said discharge device discharges voltage from an initial voltage to a final voltage, wherein said final voltage is less than said initial voltage.

3. The discharge device according to claim 1, wherein said current load element comprises at least one of a current source, a transistor, a resistive voltage divider, and a diode.

4. The discharge device according to claim 1, wherein a drain terminal of said source follower is also connected to a voltage level sensing circuit.

5. The discharge device according to claim 2, wherein said reference voltage is set approximately at a final voltage level minus the threshold voltage Vt of said source follower.

6. The discharge device according to claim 2, wherein said final voltage level is equal to the sum of the reference voltage and the threshold voltage Vt of said source follower.

7. The discharge device according to claim 2, wherein said initial voltage comprises a program voltage sufficient for programming a bit in a non-volatile memory (NVM) array, and said final voltage comprises at least one of a program verify and a read verify voltage level.

8. The discharge device according to claim 4, wherein when said capacitance load to be discharged is at a first voltage level, an output of said voltage level sensing circuit is at a first state, and when said capacitance load to be discharged is at a second voltage level, the output of said voltage level sensing circuit changes to a second state.

9. The discharge device according to claim 4, wherein said voltage level sensing circuit comprises an inverter.

10. The discharge device according to claim 8, wherein said voltage level sensing circuit comprises an inverter and said first state comprises a first logical state, wherein said current load element is initially turned off, said switch is non-conducting and said capacitance load is at a program voltage level, and wherein during discharge, said current load element is turned on, said switch becomes conducting, and current from said current load element flows through said source follower and discharges said capacitance load at a constant rate, such that when the voltage difference between said capacitance load and said reference voltage approaches the threshold voltage Vt of said source follower, said source follower becomes significantly less conducting and said second state comprises a second logical state indicating that the discharge is complete.

11. The discharge device according to claim 10, wherein after discharge, said voltage level sensing circuit returns to an initial state.

12. The discharge device according to claim 11, wherein in said initial state said current load element is non-conducting.

13. The discharge device according to claim 11, wherein in said initial state said switch is non-conducting.

14. The discharge device according to claim 10, wherein said discharge is initiated by a control signal and completed when said voltage level sensing circuit reaches said second logical state.

15. A discharge device comprising:
a sensing circuit comprising a transistor configured as a source follower, wherein a gate terminal of said source follower is connected to a reference voltage;
a drain terminal of said source follower is connected to a current load element, and a source terminal of said source follower is connected to a port of a first switch, another port of said first switch being connected to a capacitance load, said sensing circuit being operative to detect termination of discharging said capacitance load; and
a discharge circuit connected to said sensing circuit, operative to discharge said capacitance load, said discharge circuit comprising:
a second switch and a third switch with opposite polarity control such that when one of said second and third switches is conducting the other of said second and third switches is non-conducting, wherein ports of said second and third switches are connected to a common node, another port of said second switch being connected to said capacitance load and another port of said third switch being connected to another current load element;
wherein said common node is connected to a second node, said second node being connected to ground via a capacitor, said second node being further connected to a gate terminal of a PMQS transistor, wherein a source terminal of said PMOS transistor is connected to said capacitance load and a drain terminal of said PMOS transistor is connected to a predefined voltage.

16. The discharge device according to claim 15, wherein said sensing circuit is operative to output a signal that causes said second and third switches of said discharge circuit to change polarity.

17. The discharge device according to claim 15, wherein the drain terminal of said source follower of said sensing circuit is connected to an inverter.

18. The discharge device according to claim 15, wherein said predefined voltage comprises Vdd.

19. The discharge device according to claim 15, wherein said predefined voltage comprises ground.

20. The discharge device according to claim 18, wherein during a program mode, said second switch is conducting and said third switch is non-conducting, said second node charges to the voltage of said capacitance load, and said PMOS transistor of said discharge circuit is non-conducting.

21. The discharge device according to claim 18, wherein during discharge, said second switch is non-conducting and said third switch is conducting, and said second node discharges at a fixed discharge rate.

22. The discharge device according to claim 15, wherein said PMOS transistor of said discharge circuit is configured as a source follower.

23. The discharge device according to claim 20, wherein the voltage of said capacitance load equals the sum of the voltage at said second node and the threshold voltage Vt of said source follower of said discharge circuit.

24. A discharge device comprising:
a constant current supply having a reference voltage input (Vref), and outputting a constant discharge current to a discharge path; and
a voltage multiplexer operative to supply a discharge reference voltage (Vdref) from a voltage input Vdsch to said discharge path, said voltage multiplexer being connected to a NAND gate and a capacitance load;
wherein said discharge path is connected to a current-to-voltage transformer, which in turn is connected to a voltage level sensor.

25. The discharge device according to claim 24, wherein an initialization circuit inputs to said current-to-voltage transformer and said voltage level sensor.

26. The discharge device according to claim 24, wherein said voltage level sensor is operative to send a feedback signal to said NAND gate.

27. The discharge device according to claim 25, wherein said voltage multiplexer is also connected to said initialization circuit.

28. The discharge device according to claim 25, wherein said voltage multiplexer comprises an inverter connected to said NAND gate.

29. The discharge device according to claim 28, wherein said inverter outputs a signal to a gate terminal of a PMOS transistor, wherein the drain terminal and bulk of said PMOS transistor are connected to said capacitance load, and the source of said PMQS transistor is connected to said discharge path.

* * * * *